(12) United States Patent
Takano

(10) Patent No.: US 7,616,043 B2
(45) Date of Patent: Nov. 10, 2009

(54) METHODS AND APPARATUS FOR MANAGING LSI POWER CONSUMPTION AND DEGRADATION USING CLOCK SIGNAL CONDITIONING

(75) Inventor: Chiaki Takano, Austin, TX (US)

(73) Assignee: Sony Computer Entertainment Inc., Tokyo (JP)

( * ) Notice: Subject to any disclaimer, the term of this patent is extended or adjusted under 35 U.S.C. 154(b) by 86 days.

(21) Appl. No.: 12/029,764

(22) Filed: Feb. 12, 2008

(65) Prior Publication Data

US 2009/0201055 A1 Aug. 13, 2009

(51) Int. Cl.
*H03K 3/00* (2006.01)

(52) U.S. Cl. ...................... 327/295; 327/293

(58) Field of Classification Search ............... 327/293, 327/295
See application file for complete search history.

(56) References Cited

U.S. PATENT DOCUMENTS

| | | | | |
|---|---|---|---|---|
| 5,376,842 A | * | 12/1994 | Honoa et al. ............. | 326/21 |
| 5,396,129 A | * | 3/1995 | Tabira .................... | 326/93 |
| 5,430,397 A | * | 7/1995 | Itoh et al. ................ | 326/101 |
| 5,764,710 A | * | 6/1998 | Cheng et al. ............. | 375/371 |
| 6,100,734 A | * | 8/2000 | Flora ..................... | 327/156 |
| 6,255,884 B1 | * | 7/2001 | Lewyn .................... | 327/295 |
| 6,724,231 B2 | * | 4/2004 | Yoshikawa ............... | 327/291 |
| 6,867,632 B2 | * | 3/2005 | Nitta et al. .............. | 327/292 |
| 7,042,267 B1 | * | 5/2006 | Pasqualini ............... | 327/291 |
| 7,336,115 B2 | * | 2/2008 | Ehrenreich et al. ........ | 327/291 |
| 7,336,116 B2 | * | 2/2008 | Hirata et al. ............. | 327/293 |
| 2007/0040596 A1 | * | 2/2007 | Nieh et al. ............... | 327/295 |
| 2007/0216464 A1 | * | 9/2007 | Roche et al. ............. | 327/295 |

* cited by examiner

*Primary Examiner*—Lincoln Donovan
*Assistant Examiner*—William Hernandez
(74) *Attorney, Agent, or Firm*—Matthew B. Dernier, Esq.; Gibson & Dernier LLP

(57) ABSTRACT

Methods and apparatus for distributing clock signals to an integrated circuit provide for: producing, in a slow mode of operation, a first clock signal having at least first and second on-pulses of differing first and second on-times each period, respectively, where a sum of the first and second on-times is approximately equal to a sum of off-times each period; distributing the first clock signal through a distribution tree and terminating at a plurality of final buffer circuits that produce respective distributed clock signals from which respective second clock signals are produced to supply at least a portion of the integrated circuit; deleting the second on-pulse from each of the distributed clock signals each period to produce the respective second clock signals, the second clock signals each including at least a portion of the first on-pulse, but none of the second on-pulse each period.

13 Claims, 7 Drawing Sheets

CLOCK SIGNAL 18A

CONTROL SIGNAL 2A

CLOCK SIGNAL OUTPUT

CLOCK SIGNAL 18A

110B

METHODS AND APPARATUS FOR MANAGING LSI POWER CONSUMPTION AND DEGRADATION USING CLOCK SIGNAL CONDITIONING

BACKGROUND OF THE INVENTION

The present invention relates to managing the power consumption of an integrated circuit, especially a large-scale integrated circuit, using clock signal conditioning.

A system clock signal is often used by digital circuitry, such as digital circuitry implemented using an LSI circuit, to synchronously execute certain logic functions. For example, ultra-deep sub-micron (UDSM) microprocessors employ digital circuitry that uses system clock signals to synchronously execute logic functions. These microprocessors operate at system clock frequencies in excess of 1 GHz. The system clock signal of a given LSI circuit is often split into many paths to service different portions of the digital circuitry. Ideally, the system clock signals at different portions of the digital circuitry exhibit exactly the same timing characteristics so that the different portions of the digital circuitry operate in exact synchronization.

FIG. 1 illustrates a conventional clock distribution circuit 10, which includes a clock source 12, a plurality of buffers 14 (e.g., inverters), and a clock distribution tree 16 for transferring the clock signal on 18A to all areas of an LSI chip.

With reference to FIG. 2A, a conventional approach to reducing power dissipation in the LSI chip is to include a slow mode of operation, where the frequency of the clock signal (at the output) delivered to the different areas of the LSI chip is significantly lowered—while maintaining the pulse width of the "on" pulse as if in a fast mode of operation (short on-time). In other words, the off pulse of the clock signal is stretched to reduce the frequency, while maintaining the on pulse. The reason to maintain the short on-time is because many logic circuits (especially dynamic circuits) would not operate properly if long on-time clock signals were employed.

The first approach to producing the slow mode clock signal at the output is to gate the clock signal 18E at the end of the distribution tree 16 to stretch the off pulse. This is accomplished using a clock gating signal 2A and a plurality of gate circuits (not shown). The control signal 2A is used to gate (i.e., remove or mask) a number of the on-pulses of successive periods of the clock signal on 18E. A disadvantage of this approach is that it requires that the buffers 14 and the clock distribution tree 16 carry the high frequency clock from the clock source 12 to the end of the distribution tree 16. This disadvantageously results in the power dissipation of the clock distribution circuit 10 being the same in the slow and fast modes.

A second approach to producing the slow mode clock signal at the output is to stretch the off pulse of the clock signal 18A at the clock source 12. This may be accomplished by using a clock gating signal 2B (which looks the same as clock gating signal 2A), except a single gate circuit (not shown) is used at the source. The control signal 2B is used to gate (i.e., remove or mask) a number of the on-pulses of successive periods of the clock signal on 18A, resulting in a waveform at the output of the circuit 10 that looks substantially the same as the waveform in FIG. 2B. While this second approach reduces the power dissipation in the distribution circuit, both PBTI (positive bias temperature instability) degradation and NBTI (negative bias temperature instability) degradation results within the distribution circuit. (PBTI and NBTI are long-term degradation concerns.) These circuit degradations result because certain of the gates experience negative or positive bias conditions for significantly longer periods that other gates in the LSI. In particular, the clock signals on line 18A, 18B, 18C, etc., have 1/10 units of on-time and 9/10 units of off-time each period. The intervening clock signals (between 18A, 18B, 18C, etc.) have 9/10 units of on-time and 1/10 units of off-time each period. Thus, disadvantageously, design margins must be employed to account for PBTI and/or NBTI.

In view of the above, the conventional techniques for reducing power consumption by way of a slow mode of operation have been unsatisfactory. Accordingly, there is a need in the art for a new and better solution to the problem, which preferably does not require the power dissipation of the clock distribution circuit being the same in the slow and fast modes, and does not result in PBTI and/or NBTI.

SUMMARY OF THE INVENTION

In accordance with one or more aspects of the invention, the clock signal distributed through a clock distribution tree is of a relatively low frequency (during a slow mode of operation) and exhibits about 50% on-time and 50% off-time each period. These dual characteristics of the clock signal are achieved by stretching the off pulse and inserting a relatively wide "dummy on-pulse" to increase the on-time of each period. The dummy on-pulse is removed at the end of the distribution tree so that the low frequency (short on-time) clock signal is received at the various areas of the LSI. This results in low power dissipation and low PBTI and NBIT degradation through the clock distribution circuit.

In accordance with one or more embodiments of the present invention, methods and apparatus for distributing clock signals to an integrated circuit, provide for: producing, in a slow mode of operation, a first clock signal having at least first and second on-pulses of differing first and second on-times each period, respectively, where a sum of the first and second on-times is approximately equal to a sum of off-times each period; and distributing the first clock signal through a distribution tree and terminating at a plurality of final buffer circuits that produce respective distributed clock signals from which respective second clock signals are produced to supply at least a portion of the integrated circuit.

The methods and apparatus may further provide for deleting the second on-pulse from each of the distributed clock signals each period to produce the respective second clock signals, the second clock signals each including at least a portion of the first on-pulse, but none of the second on-pulse each period.

In a normal mode of operation the first clock signal is produced having one on-pulse and one off-pulse of substantially equal on and off times, respectively, each period.

In accordance with one or more further embodiments of the present invention, a clock distribution system for an integrated circuit, includes: a clock circuit operable, in a slow mode of operation, to produce a first clock signal having at least first and second on-pulses of differing first and second on-times each period, respectively, where a sum of the first and second on-times is approximately equal to a sum of off-times each period; a plurality of buffer circuits operable to distribute the first clock signal, the plurality of buffer circuits including a distribution tree terminating at a plurality of final buffer circuits that produce respective distributed clock signals; and a clock gating circuit operable to receive the distributed clock signals and produce respective second clock signals to at least a portion of the integrated circuit, the second clock signals each including at least a portion of the first on-pulse, but none of the second on-pulse each period.

The clock circuit is operable, in a normal mode of operation, to produce the first clock signal having one on-pulse and one off-pulse of substantially equal on and off times, respectively.

The clock circuit is preferably operable to produce a gate control signal responsive to the slow mode of operation. The clock gating circuit is preferably operable to delete the second on-pulse from each of the distributed clock signals each period in response to the gate control signal when the clock circuit in the slow mode of operation. The clock gating circuit may include, for each of the distributed clock signals, a respective latch circuit operable to latch a value derived from the gate control signal in response to an edge of the respective one of the distributed clock signals to produce a mask signal. The mask signal is gated with the respective one of the distributed clock signals to delete the second on-pulse therefrom.

Other aspects, features, advantages, etc. will become apparent to one skilled in the art when the description of the preferred embodiments of the invention herein is taken in conjunction with the accompanying drawings.

BRIEF DESCRIPTION OF THE DRAWINGS

For the purposes of illustrating the various aspects of the invention, there are shown in the drawings forms that are presently preferred, it being understood, however, that the invention is not limited to the precise arrangements and instrumentalities shown.

DETAILED DESCRIPTION OF THE PREFERRED EMBODIMENTS

Figure 1:
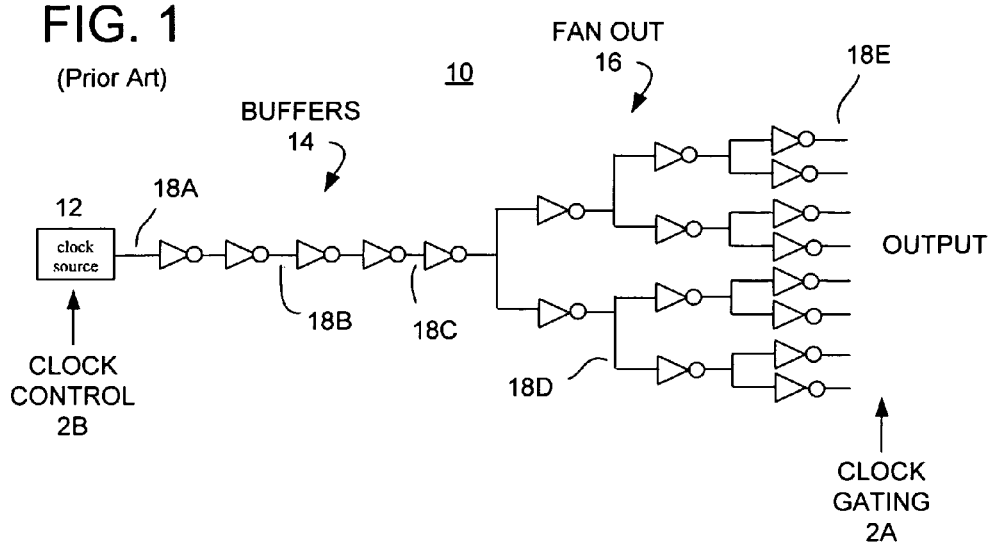
FIG. 1 is a schematic diagram of a circuit in which a clock signal is distributed through a conventional distribution tree, and in which alternative conventional approaches for implementing a slow mode of operation are illustrated.
Figure 2A:
FIGS. 2A-2B are timing diagrams illustrating relationships between certain signals within the circuit of FIG. 1.
Figure 2A:
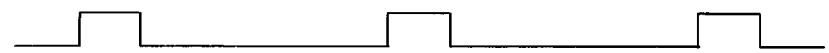
Figure 2A:
Figure 2B:
Figure 3A:
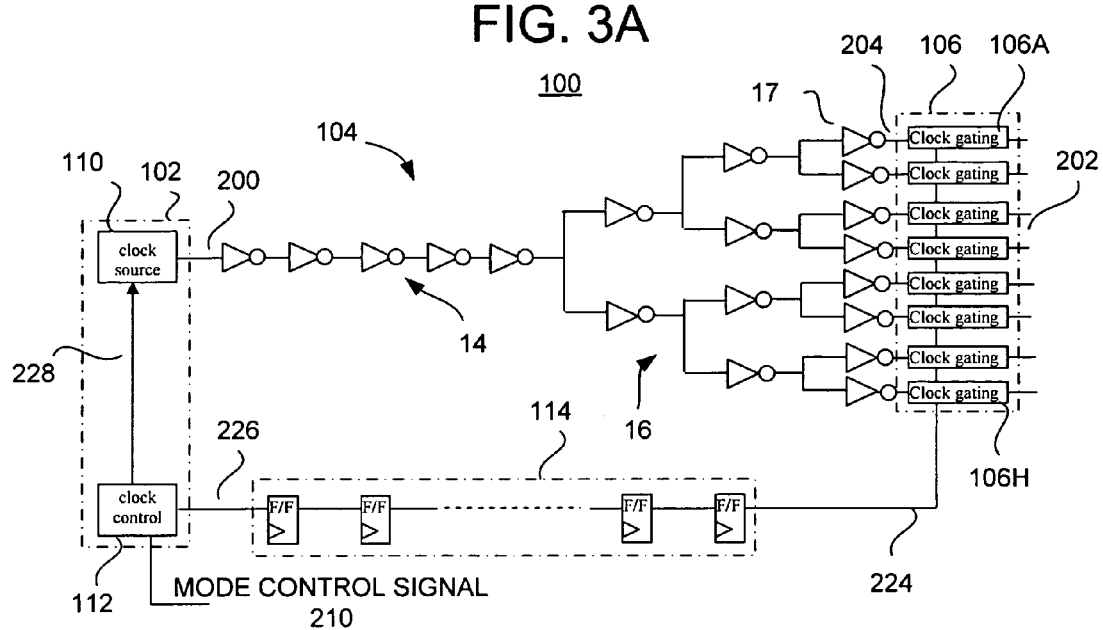
FIG. 3A is a schematic diagram of a clock distribution circuit having slow mode capability in accordance with one or more embodiments of the present invention.

With reference to the drawings, where like numerals indicate like elements, there is shown in FIG. 3A a clock distribution system 100 that is operable to distribute and split a first clock signal 200 at a source thereof to deliver respective second clock signals 202 to different portions of a circuit, such as a large scale integrated digital circuit. The clock distribution system 100 is operable to provide the second clock signals 200 at a relatively high frequency and roughly 50% duty cycle in a normal mode of operation. While this mode of operation permits the digital circuit to which the second clock signals 200 are fed to operate and a high throughput, such high frequency of operation results in significant power dissipation. The clock distribution system 100 is also operable to provide the second clock signals 200 at a relatively low frequency and significantly lower duty cycle in a slow mode of operation. The slow mode of operation results in significant power dissipation reduction.

Specifically, the clock distribution system 100 includes a clock circuit 102, a distribution circuit 104, and a clock gating circuit 106. The clock circuit 102 is operable to produce the first clock signal 200 and deliver same to the distribution circuit 104. The distribution circuit 104 is operable to transmit and fan out the first clock signal 200 to various portions of the digital circuit. The distribution circuit 104 includes a plurality of buffer circuits operable to distribute the first clock signal 200, the plurality of buffer circuits including series coupled buffers 14 and parallel coupled buffers 16 (a distribution tree) terminating at a plurality of final buffer circuits 17. At the terminus of the distribution circuit 104, the clock signals output from the final buffer circuits 17 are distributed clock signals 204. The clock gating circuit 106 includes a plurality of gate circuits 106A, 106B, ... 106H, where each gate circuit 106i is operable to manipulate the characteristics of a respective one of the distributed clock signals 204.

In the normal mode of operation, the distributed clock signals 204 may already have the desired characteristics (e.g., high frequency, 50% duty cycle) for delivery to the digital circuit, and thus the gating circuit 106 may not manipulate the characteristics of the distributed clock signals 204. In the slow mode of operation, the distributed clock signals 204 may have desired characteristics for distribution and fan out, but not for delivery to the digital circuit. Thus, the gating circuit 106 may be operable to manipulate the characteristics of the distributed clock signals 204 prior to delivery to the digital circuit. The above functionality of the gating circuit 106 will be discussed in more detail later herein.

The clock circuit 102 includes a clock source circuit 110, and a clock control circuit 112. It is understood that this circuit partitioning is shown by way of example only and that many modifications as to the specific partitioning may be made without departing from the scope of the invention. The clock source circuit is operable to produce the first clock signal 102 with characteristics that change as a function of the mode of operation, normal mode or slow mode. The normal mode and slow mode are enabled by way of a level of the mode control signal 210. In this regard, the clock circuit 102 (and specifically the clock source 110 thereof) is operable, in the normal mode of operation, to produce the first clock signal 200 having one on-pulse and one off-pulse of substantially equal on and off times, respectively.

Figure 4:
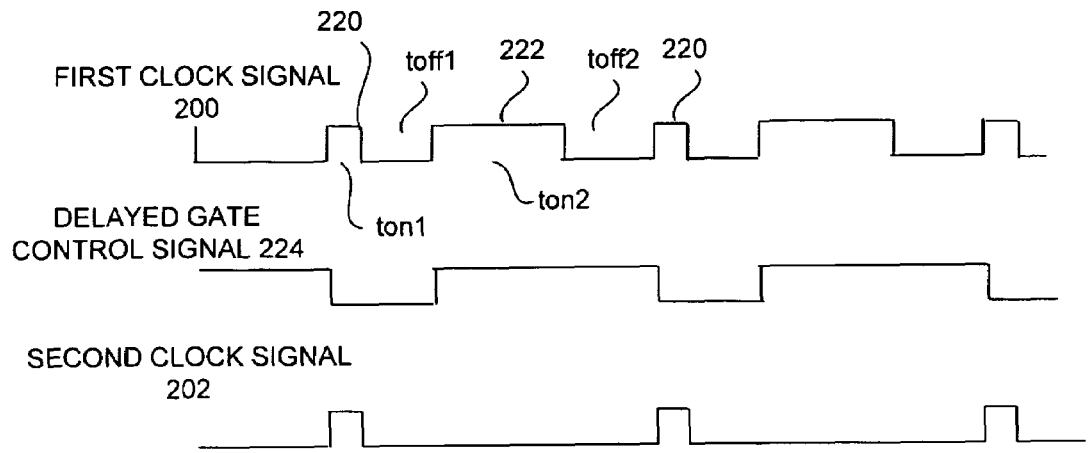
FIG. 4 is a timing diagram illustrating relationships between certain signals within the circuit of FIG. 3A.

With reference to FIG. 4, the clock source circuit 110, in the slow mode of operation, is operable to produce the first clock signal 102 as illustrated. Specifically, the characteristics of the first clock signal 102 include at least first and second on-pulses 220, 222 of differing first and second on-times, ton1, ton2, respectively, each period. In order to address the PBTI and NBIT degradation issue, the sum of the first and second on-times is approximately equal to a sum of off-times (toff1, toff2) each period. Thus, the clock signals on the respective lines of the distribution circuit 104, no matter where in the circuit, exhibit approximately 50% total on-time and 50% total off-time each period.

As will be discussed in more detail below, and depending on the clock circuit 102 implementation, the first on-pulse 220 may have the desired on-time for the second clock signal 202. The second on-pulse 222, however, may be viewed as a "dummy" or extra pulse that has been inserted into what would have been a stretched off-pulse. This extra pulse 222 must be removed from the distributed clock signals 204 in order to produce the second clock signals 202 (which exhibit the necessary characteristics for proper digital circuit operation of the integrated circuit.) The clock gating circuit 106 is operable to receive the distributed clock signals 204 and produce the respective second clock signals 202 such that the second clock signals 202 each include at least a portion of the first on-pulse 220, but none of the second on-pulse 222 each period.

Figure 3B:
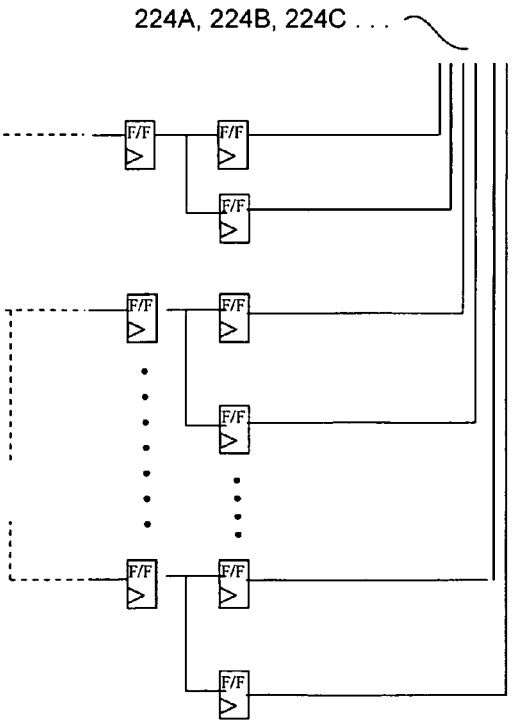
FIG. 3B is a schematic diagram of an alternative flip-flop circuit for propagating the gate control signal to a plurality of clock gating circuits.

In essence, the clock gating circuit 106 is operable to delete the second on-pulse 220 from each of the distributed clock signals 204 each period in response to a "delayed" gate control signal 224. The delayed gate control signal 224 is delivered by a plurality of series coupled flip-flop circuits 114. The clock control circuit 112 is operable to produce the gate control signal 226, which is input into the plurality of flip-flop circuits 114. Alternatively, with reference to FIG. 3B, the delayed gate control signal 224 may be comprised of a plurality of signals 224A, 224B, 224C, etc., which are delivered by a plurality of flip-flop circuits 114A arranged in a tree that fans out into a plurality of stages. A first of the flip-flops receives the gate control signal 226 from the clock circuit 102, and a last stage of the flip-flip circuits 114A provides a set of delayed versions of the gate control signal 224A, 224B, 224C. The number of delayed gate control signals 224A, 224B, 224C, may match the number of clock gating circuits 106A, 106B, etc. The number of delayed gate control signals 224A, 224B, 224C, may not match the number of clock gating circuits 106A, 106B, etc., in case the delayed gate control signals 224A, 224B, 224C, are provided into a plurality of clock gating circuits. Again, the clock gating circuit 106 is operable to receive the distributed clock signals 204 and mask out the second on-pulse 222 each period in response to the delayed gate control signals 224A, 224B, 224C, etc.

Figure 5:
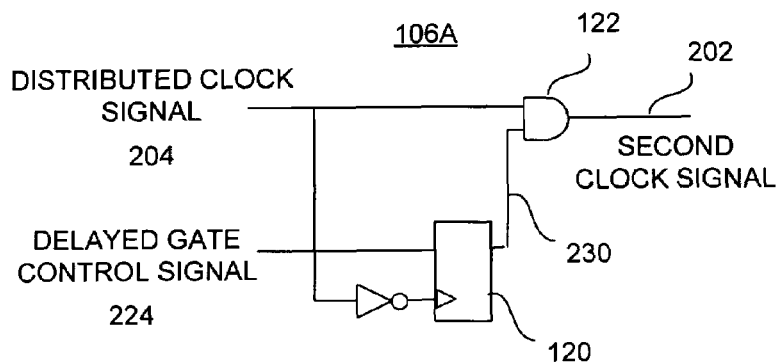
FIG. 5 is a schematic diagram of logic that may be used to implement a portion of the clock gating circuit of FIG. 3A.

FIG. 5 is a schematic diagram of logic that may be used to implement one of the gate circuits 106, such as gate circuit 106A. The gate circuit 106A includes a latch circuit 120, such as a flip-flop operable to latch a value derived from the delayed gate control signal 224 in response to an edge of the respective one of the distributed clock signals 204 to produce a mask signal 230. The mask signal 230 is gated (e.g., via AND gate 122) with the respective one of the distributed clock signals 204 to delete the second on-pulse 222 therefrom. This results in one of the second clock signals 202.

Figure 6:
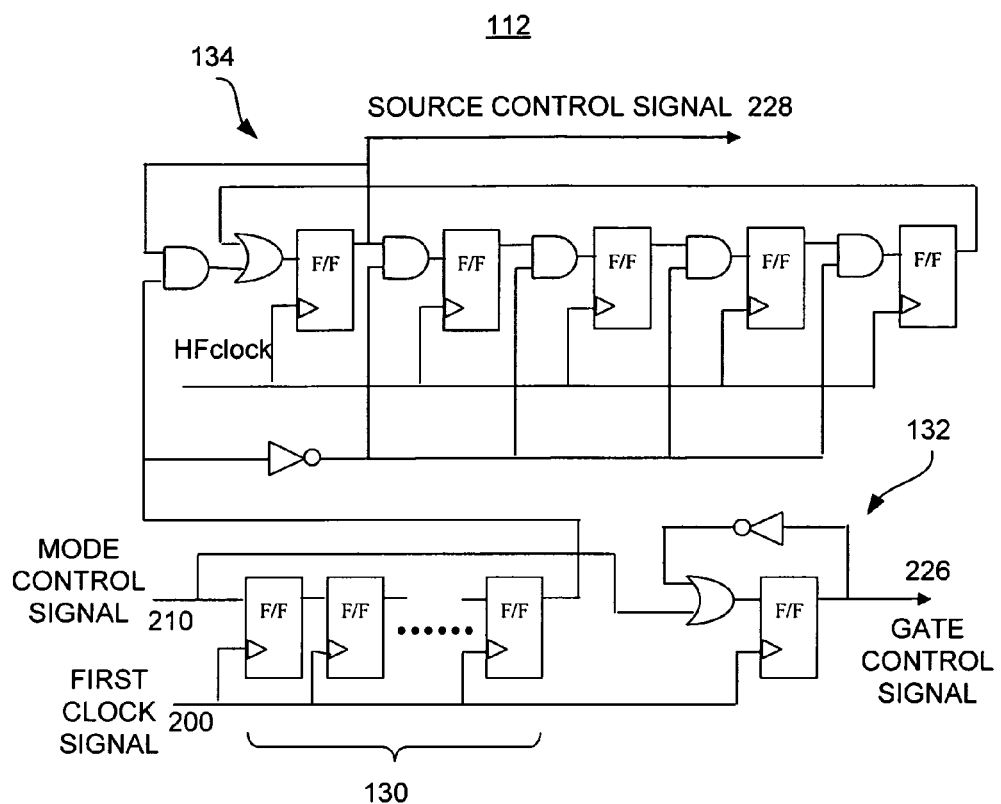
FIG. 6 is a schematic diagram of logic that may be used to implement a portion of the clock circuit of FIG. 3A.

With reference to FIG. 6, the clock control circuit 112 may be implemented using the illustrated logic. It is understood that the specific implementation of the clock control circuit 112 shown in FIG. 6 is provided by way of example only, and that many other variations are possible and available to the skilled artisan in view of the disclosure herein.

The illustrated clock control circuit 112 includes a first series coupled flip-flop circuit 130, a latch circuit 132, and a second series coupled flip-flop circuit 134. The latch circuit 132 receives the mode control signal 210 and produces the gate control signal 226, having an on-pulse train synchronous with the rising edge of the first on-pulse 220 of the first clock signal 200. The first series coupled flip-flop circuit 130 receives the mode control signal 210 and is clocked by the first clock signal 200. When the mode control signal 210 is low, the clock circuit 102 is in the slow mode of operation. The number of flip flops in the first series coupled flip-flop circuit 130 is preferably equal to the number of flip-flops in the circuit 114 of FIG. 3A. The second series coupled flip-flop circuit 134 is clocked with a high frequency clock signal, HFclock, which is preferably of about 50% duty cycle and produces a source control signal 228 used by the clock source circuit 110 to set the characteristics of the first clock signal 200 (normal or slow mode).

Figure 7:
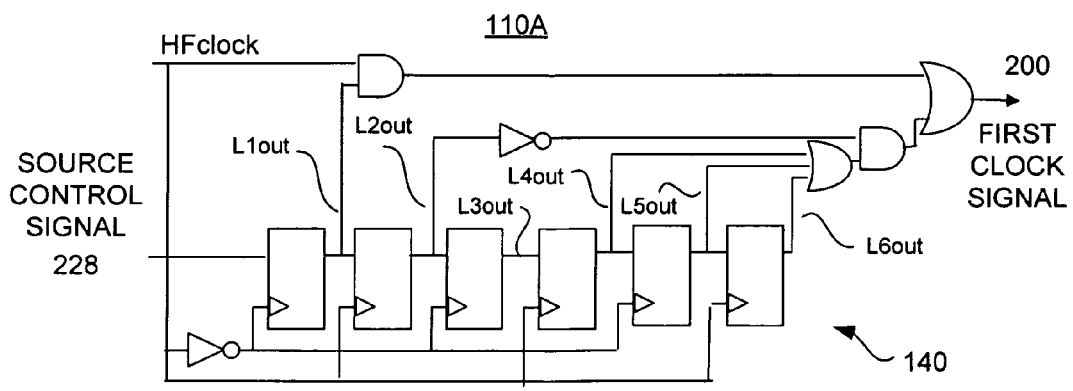
FIG. 7 is a schematic diagram of logic that may be used to implement another portion of the clock circuit of FIG. 3A.

With reference to FIG. 7, a first embodiment of the clock source circuit 110A may be implemented using the illustrated logic. It is understood that the specific implementation of the clock source circuit 110A shown in FIG. 7 is provided by way of example only, and that many other variations are possible and available to the skilled artisan in view of the disclosure herein. The illustrated clock source circuit 110A includes a series coupled flip-flop circuit 140, which receives the source control signal 228 and a combination of gates receiving inputs derived from the HFclock and the outputs from respective flip-flops of the circuit 140. The resulting output is the first clock signal 200.

Figure 9:
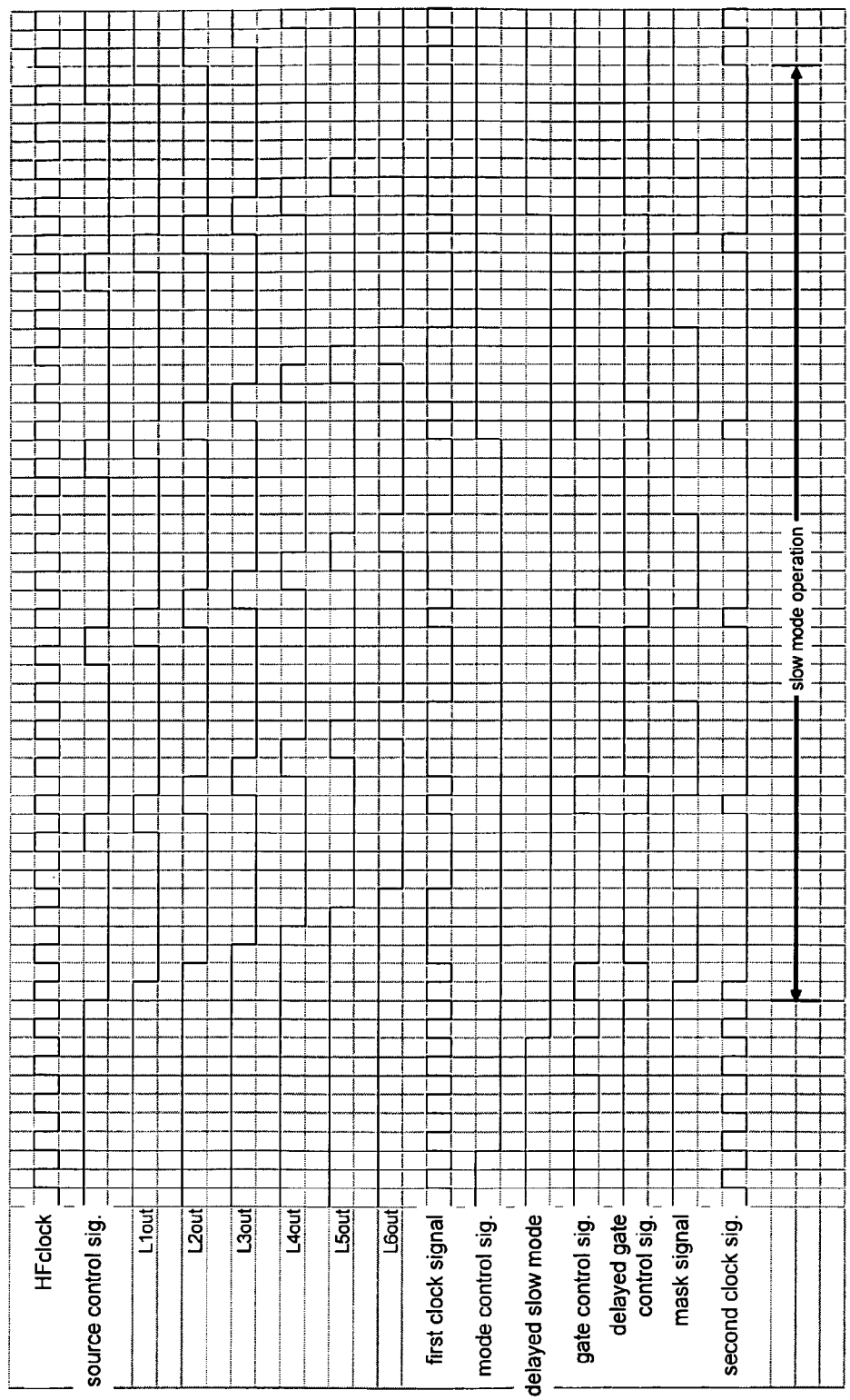
FIG. 9 is a timing diagram illustrating relationships between the signals of the combined circuits of FIGS. 5, 6, and 7.

The synchronous (and non-synchronous) relationships among the signals of the clock circuit 100 formed from the combined clock control circuit 112 (FIG. 6), the clock source circuit 110A (FIG. 7) and the gate circuit 106 (FIG. 5) are illustrated in the timing diagram of FIG. 9.

Figure 8:
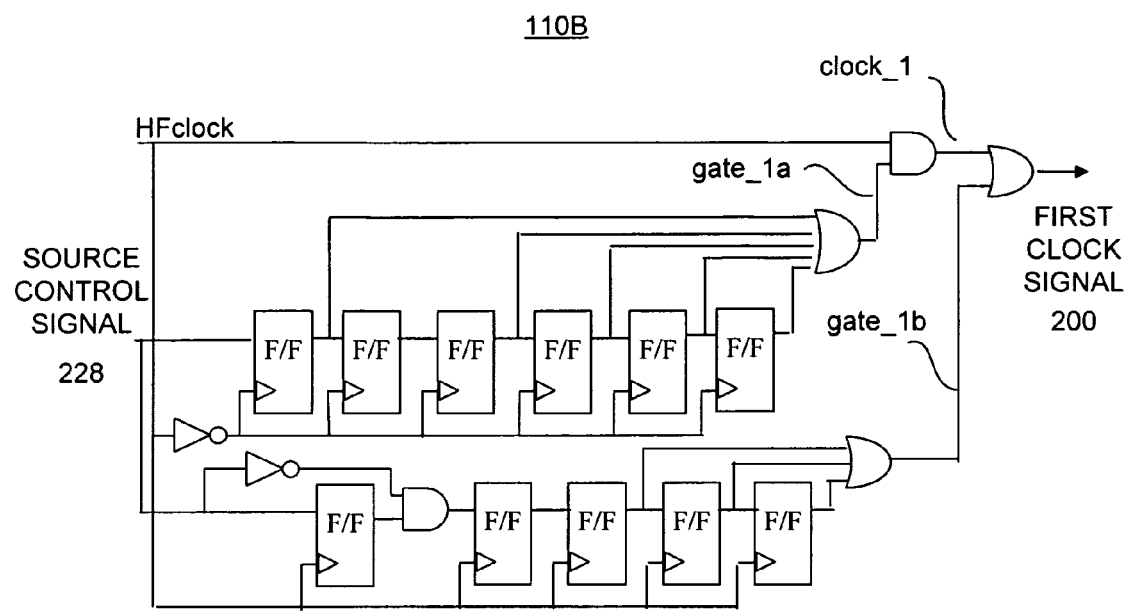
FIG. 8 is a schematic diagram of logic that may be used as an alternative to the circuit of FIG. 6 to implement a portion of the clock circuit of FIG. 3A.

With reference to FIG. 8, a second embodiment of the clock source circuit 110B may be implemented using the illustrated logic. Again, it is understood that the specific implementation of the clock source circuit 110B shown in FIG. 8 is provided by way of example only, and that many other variations are possible and available to the skilled artisan in view of the disclosure herein. The illustrated clock source circuit 110B includes first and second series coupled flip-flop circuits, each of which receives the source control signal 228. A combination of gates receives inputs derived from the HFclock and the outputs from respective flip-flops of the first and second series coupled flip-flop circuits. The resulting output is the first clock signal 200.

Figure 10:
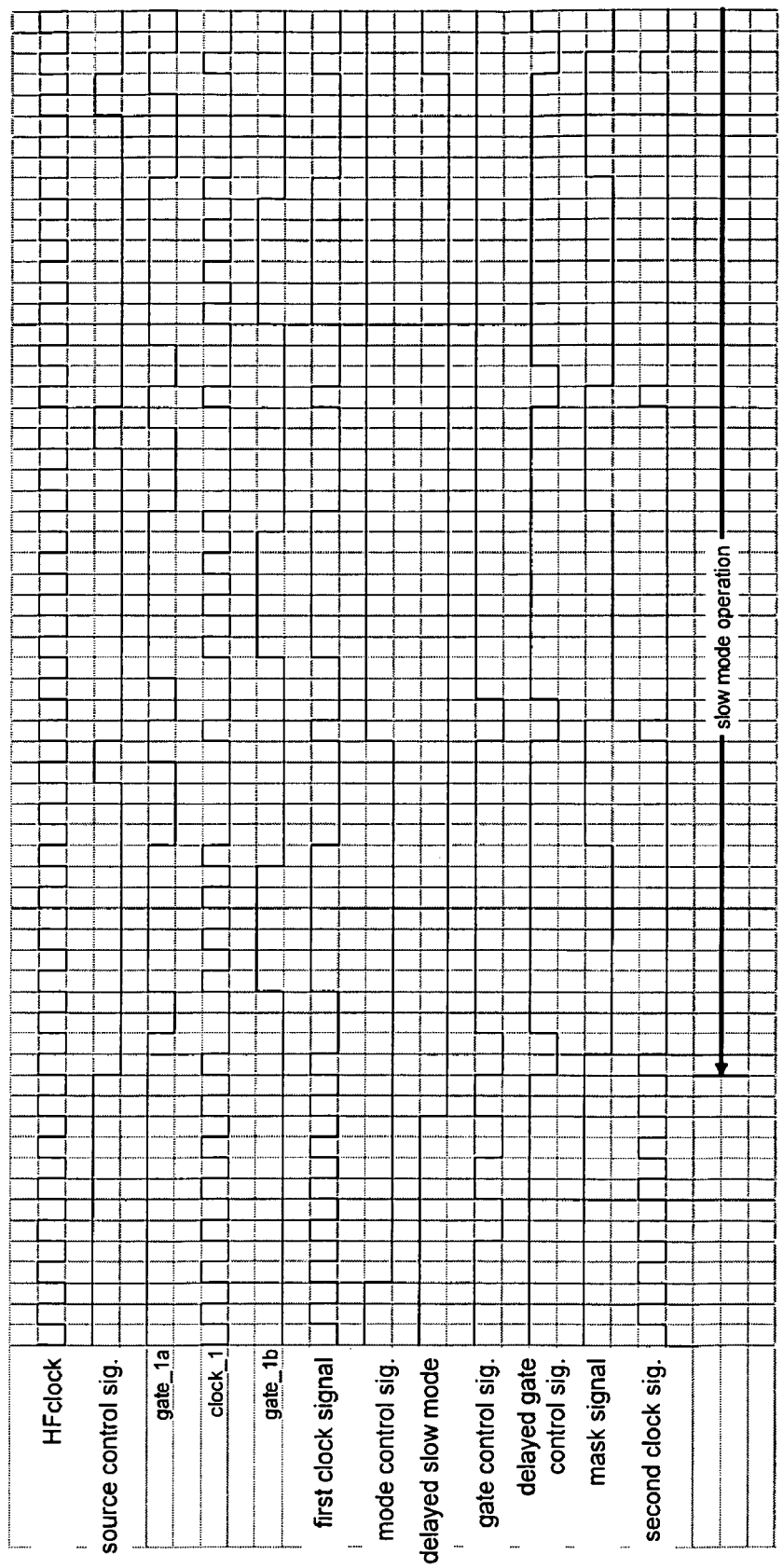
FIG. 10 is a timing diagram illustrating relationships between the signals of the combined circuits of FIGS. 5, 6, and 8.

The synchronous (and non-synchronous) relationships among the signals of the clock circuit 100 formed from the combined clock control circuit slightly modified from 112 (FIG. 6), the clock source circuit 110B (FIG. 8) and the gate circuit 106 (FIG. 5) are illustrated in the timing diagram of FIG. 10.

It is noted that the methods and apparatus described thus far and/or described later in this document may be achieved utilizing any of the known technologies, such as standard digital circuitry, analog circuitry, microprocessors, digital signal processors, any of the known processors that are operable to execute software and/or firmware programs, programmable digital devices or systems, programmable array logic devices, or any combination of the above, including devices now available and/or devices which are hereinafter developed. One or more embodiments of the invention may also be embodied in digital circuitry in LSI circuits.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. An integrated circuit, comprising:
 a clock circuit operable, in a slow mode of operation, to produce a first clock signal having at least first and second on-pulses of differing first and second on-times each period, respectively, where a sum of the first and second on-times is approximately equal to a sum of off-times each period;

a plurality of buffer circuits operable to distribute the first clock signal, the plurality of buffer circuits including a distribution tree terminating at a plurality of final buffer circuits that produce respective distributed clock signals; and a clock gating circuit operable to receive the distributed clock signals and produce respective second clock signals to at least a portion of the integrated circuit, the second clock signals each including at least a portion of the first on-pulse, but none of the second on-pulse each period.

2. A clock distribution system for an integrated circuit, comprising:

a clock circuit operable, in a slow mode of operation, to produce a first clock signal having at least first and second on-pulses of differing first and second on-times each period, respectively, where a sum of the first and second on-times is approximately equal to a sum of off-times each period;

a plurality of buffer circuits operable to distribute the first clock signal, the plurality of buffer circuits including a distribution tree terminating at a plurality of final buffer circuits that produce respective distributed clock signals; and a clock gating circuit operable to receive the distributed clock signals and produce respective second clock signals to at least a portion of the integrated circuit, the second clock signals each including at least a portion of the first on-pulse, but none of the second on-pulse each period.

3. The clock distribution system of claim 2, wherein the clock circuit is operable, in a normal mode of operation, to produce the first clock signal having one on-pulse and one off-pulse of substantially equal on and off times, respectively.

4. The clock distribution system of claim 2, wherein:

the clock circuit is operable to produce a gate control signal responsive to the slow mode of operation; and the clock gating circuit is operable to delete the second on-pulse from each of the distributed clock signals each period in response to the gate control signal when the clock circuit in the slow mode of operation.

5. The clock distribution system of claim 4, wherein:

the clock gating circuit includes, for each of the distributed clock signals, a respective latch circuit operable to latch a value derived from the gate control signal in response to an edge of the respective one of the distributed clock signals to produce a mask signal; and the respective distributed clock signals are gated with the mask signal to delete the second on-pulse therefrom.

6. The clock distribution system of claim 5, further comprising a plurality of flip flops coupled in series, a first of the flip-flops receiving the gate control signal from the clock circuit, and a last of the flip-flips providing a delayed version of the gate control signal from which the value is derived.

7. The clock distribution system of claim 5, further comprising a plurality of flip flops coupled in a tree-arrangement having a plurality of stages, a first of the flip-flops receiving the gate control signal from the clock circuit, and a last stage of the flip-flips providing a set of delayed versions of the gate control signal from which the value is derived.

8. The clock distribution system of claim 4, wherein the clock circuit comprises:

a first series coupled flip-flop circuit clocked by the first clock signal and producing an intermediate signal in response thereto;

a latch circuit operating to produce the gate control signal in response to a slow mode control signal, where the gate control signal includes an on-pulse train synchronous with a rising edge of the first on-pulse of the first clock signal;

a second series coupled flip-flop circuit clocked with a high frequency clock, and operating to produce a source control signal in response to the intermediate signal, such that the slow mode control signal, when low, indicates that the clock circuit is to operate in the slow mode of operation, and the source control signal is used to produce the first clock signal.

9. The clock distribution system of claim 8, wherein the clock circuit further comprises:

a third series coupled flip-flop circuit, clocked by the high frequency clock, and operating to receive the source control signal in a first of a plurality of flip-flops of the third series coupled flip-flop circuit; and a combination of logic gates receiving inputs from the high frequency clock and respective outputs from each of the remaining plurality of flip-flops of the third series coupled flip-flop circuit, and operating to produce the first clock signal in response thereto.

10. The clock distribution system of claim 8, wherein the clock circuit further comprises:

a third series coupled flip-flop circuit, clocked by the high frequency clock, and operating to receive the source control signal in a first of a plurality of flip-flops of the third series coupled flip-flop circuit;

a fourth series coupled flip flop circuit, clocked by the high frequency clock, and operating to receive the source control signal in a first of a plurality of flip-flops of the fourth series coupled flip-flop circuit; and a combination of logic gates receiving inputs from the high frequency clock and respective outputs from a respective plurality of the remaining plurality of flip-flops of the third and fourth series coupled flip-flop circuits, and operating to produce the first clock signal in response thereto.

11. A method of distributing clock signals to an integrated circuit, comprising:

producing, in a slow mode of operation, a first clock signal having at least first and second on-pulses of differing first and second on-times each period, respectively, where a sum of the first and second on-times is approximately equal to a sum of off-times each period; and distributing the first clock signal through a distribution tree and terminating at a plurality of final buffer circuits that produce respective distributed clock signals from which respective second clock signals are produced to supply at least a portion of the integrated circuit.

12. The method of claim 11, further comprising deleting the second on-pulse from each of the distributed clock signals each period to produce the respective second clock signals, the second clock signals each including at least a portion of the first on-pulse, but none of the second on-pulse each period.

13. The method of claim 11, further comprising producing the first clock signal having one on-pulse and one off-pulse of substantially equal on and off times, respectively, in a normal mode of operation.

* * * * *